(12) United States Patent
Wang et al.

(10) Patent No.: US 11,172,577 B2
(45) Date of Patent: Nov. 9, 2021

(54) DISPLAY DEVICE HAVING AN OPTICAL SENSOR

(71) Applicant: SAMSUNG DISPLAY CO., LTD., Yongin-si (KR)

(72) Inventors: Ji Young Wang, Hwaseong-si (KR); So Yeon Joo, Yongin-si (KR); Hyun Hee Lee, Seoul (KR); Se Hun Park, Cheonan-si (KR); Chang Mo Park, Seoul (KR); Jong Man Bae, Hwaseong-si (KR); Hyeon Deuk Hwang, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 20 days.

(21) Appl. No.: 16/523,691

(22) Filed: Jul. 26, 2019

(65) Prior Publication Data
US 2020/0045826 A1    Feb. 6, 2020

(30) Foreign Application Priority Data

Jul. 31, 2018    (KR) .................. 10-2018-0089089

(51) Int. Cl.
| | |
|---|---|
| *H05K 1/00* | (2006.01) |
| *H05K 1/02* | (2006.01) |
| *H05K 1/03* | (2006.01) |
| *H05K 1/18* | (2006.01) |
| *H01L 27/32* | (2006.01) |

(Continued)

(52) U.S. Cl.
CPC .......... *H05K 1/189* (2013.01); *G06K 9/0004* (2013.01); *H01L 51/529* (2013.01); *H01L 51/5253* (2013.01); *H05K 1/147* (2013.01); *G06F 3/041* (2013.01); *H01L 27/3244* (2013.01); *H05K 2201/056* (2013.01);

(Continued)

(58) Field of Classification Search
CPC .. H05K 1/00; H05K 1/02; H05K 1/03; H05K 1/18; H05K 1/181; H05K 1/189; H01L 27/32; H01L 27/146; G06F 1/16; G06K 9/00; G06K 9/02
USPC .......... 361/749; 345/173, 174, 690; 349/62; 438/80, 113
See application file for complete search history.

(56) References Cited

U.S. PATENT DOCUMENTS

| | | | |
|---|---|---|---|
| 9,482,885 | B2 | 11/2016 | Joo et al. |
| 10,123,424 | B1* | 11/2018 | Lee ................. H05K 1/0278 |

(Continued)

FOREIGN PATENT DOCUMENTS

| | | |
|---|---|---|
| EP | 2 960 712 A1 | 12/2015 |
| EP | 3 236 390 A1 | 10/2017 |
| KR | 10-2017-0141522 | 12/2017 |

OTHER PUBLICATIONS

Extended European Search Report for Application Serial No. 19189183.7 dated Nov. 19, 2020.

*Primary Examiner* — Xiaoliang Chen
(74) *Attorney, Agent, or Firm* — F. Chau & Associates, LLC

(57) ABSTRACT

A display device includes a display panel having a display area and a non-display area at least partially surrounding the display area. A panel support sheet is disposed behind the display panel and has a first hole exposing the display area of the display panel. An optical sensor is disposed within the first hole. A first light-blocking portion is disposed in a void area that is between the panel support sheet and the optical sensor, within the first hole.

19 Claims, 15 Drawing Sheets

(51) Int. Cl.
*H01L 27/146* (2006.01)
*G06F 1/16* (2006.01)
*G06K 9/00* (2006.01)
*H05K 1/14* (2006.01)
*H01L 51/52* (2006.01)
*G06F 3/041* (2006.01)

(52) U.S. Cl.
CPC .......... *H05K 2201/10121* (2013.01); *H05K 2201/10128* (2013.01); *H05K 2201/10151* (2013.01)

(56) References Cited

U.S. PATENT DOCUMENTS

| | | | |
|---|---|---|---|
| 10,690,973 B2* | 6/2020 | Yueh | H01L 51/52 |
| 2010/0029339 A1* | 2/2010 | Kim | H04M 1/0266 |
| | | | 455/566 |
| 2011/0037786 A1* | 2/2011 | Hasegawa | G09G 3/3233 |
| | | | 345/690 |
| 2011/0069254 A1* | 3/2011 | Takama | G02B 3/14 |
| | | | 349/62 |
| 2011/0216315 A1* | 9/2011 | Uematsu | G01J 3/0262 |
| | | | 356/326 |
| 2014/0008653 A1* | 1/2014 | Chang | H01L 27/1443 |
| | | | 257/53 |
| 2015/0346867 A1* | 12/2015 | Miyake | G06F 3/0446 |
| | | | 345/174 |
| 2015/0355763 A1* | 12/2015 | Miyake | G06F 1/16 |
| | | | 345/174 |
| 2016/0086895 A1* | 3/2016 | Ebisui | H01L 23/29 |
| | | | 257/692 |
| 2016/0098109 A1* | 4/2016 | Choi | G06F 3/0443 |
| | | | 345/174 |
| 2016/0188059 A1* | 6/2016 | Lee | G06F 3/04164 |
| | | | 345/173 |
| 2016/0219695 A1* | 7/2016 | Choi | H01L 24/83 |
| 2016/0266695 A1* | 9/2016 | Bae | G06F 3/04166 |
| 2016/0363800 A1* | 12/2016 | Kim | G02F 1/13452 |
| 2017/0045918 A1* | 2/2017 | Han | G02F 1/13318 |
| 2017/0078513 A1* | 3/2017 | Chang | H04N 1/10 |
| 2017/0287992 A1* | 10/2017 | Kwak | G06F 1/1626 |
| 2017/0300736 A1* | 10/2017 | Song | G06K 9/0004 |
| 2017/0364763 A1* | 12/2017 | Jin | G06F 21/32 |
| 2017/0371464 A1* | 12/2017 | Nakanishi | G06F 3/0412 |
| 2017/0372114 A1* | 12/2017 | Cho | G01J 1/0233 |
| 2018/0150106 A1* | 5/2018 | Jang | G06F 1/1641 |
| 2018/0151641 A1* | 5/2018 | Choo | G06F 1/1643 |
| 2018/0178034 A1* | 6/2018 | Iguchi | A61N 5/0616 |
| 2018/0204526 A1* | 7/2018 | Heo | H05K 5/03 |
| 2018/0356661 A1* | 12/2018 | Lee | H01L 27/124 |
| 2019/0012555 A1* | 1/2019 | Bae | G06K 9/2027 |
| 2019/0197286 A1* | 6/2019 | Kim | H01L 27/3244 |
| 2019/0227361 A1* | 7/2019 | Yueh | H01L 51/52 |
| 2020/0019804 A1* | 1/2020 | Kim | G06K 9/00912 |

* cited by examiner

DISPLAY DEVICE HAVING AN OPTICAL SENSOR

This application claims priority to Korean Patent Application No. 10-2018-0089089, filed on Jul. 31, 2018 in the Korean Intellectual Property Office, the disclosure of which is herein incorporated by reference in its entirety.

TECHNICAL FIELD

The present disclosure relates to a display device and, more specifically, to a display device having an optical sensor.

DISCUSSION OF THE RELATED ART

A display device is an output device for presenting information in a visual form. Display devices are used in a variety of devices such as smart phones. Display devices, such as those used in smartphones, may have additional features such as an optical sensor, a fingerprint recognition sensor, an iris recognition sensor, a proximity sensor, etc.

For example, the optical sensor may be an infrared optical sensor. The infrared optical sensor may include a light-emitting part that emits infrared rays and a sensor that receives the infrared rays that have been reflected off of a surface, such as the face of the user. The infrared optical sensor may perform a sensing function by measuring the time that it takes for the emitted infrared rays to be reflected and received by the sensor.

Such an optical sensor may be disposed directly under the window of the display device or behind the display panel of the display device. By disposing the optical sensor behind the display panel, it is possible to reduce the part of the non-display area occupied by the optical sensor, so that the bezel of the display device can be reduced.

SUMMARY

A display device includes a display panel having a display area and a non-display area at least partially surrounding the display area. A panel support sheet is disposed behind the display panel and has a first hole exposing the display area of the display panel. An optical sensor is disposed within the first hole. A first light-blocking portion is disposed in a void area that is between the panel support sheet and the optical sensor, within the first hole.

A display device includes a display panel having a display area and a non-display area at least partially surrounding the display area. A driving circuit board is disposed behind the display panel. The driving circuit board is electrically connected to the display panel. The driving circuit board includes a first hole exposing the display area of the display panel. An optical sensor is disposed within the first hole. A first light-blocking portion is disposed behind the optical sensor. The first light-blocking portion partially overlaps the driving circuit board and the optical sensor, and covers a void area between the driving circuit board and the optical sensor in the first hole.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
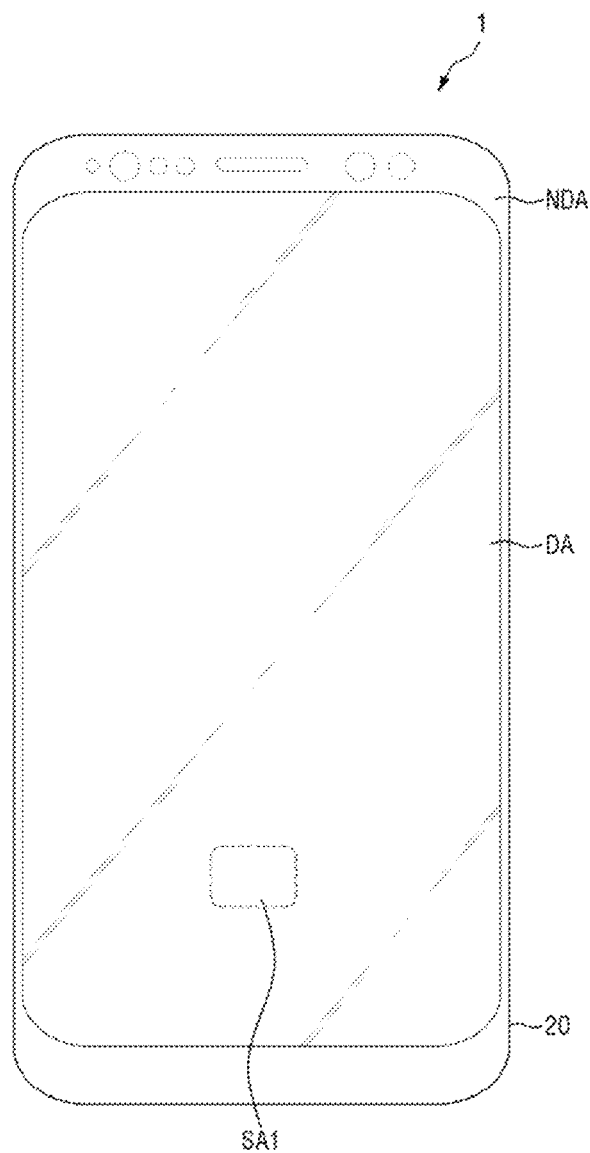
FIG. 1 is a perspective view illustrating a display device according to an exemplary embodiment of the present disclosure.

Features of the inventive concept and methods of accomplishing the same may be understood more readily by reference to the following detailed description of embodiments and the accompanying drawings. The inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art.

It will be understood that when an element or layer is referred to as being "on", "connected to" or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

In the drawings, components may be exaggerated or reduced in size for convenience of explanation.

Throughout the specification and drawings, like reference numerals may refer to like elements.

Hereinafter, exemplary embodiments of the present disclosure will be described with reference to the accompanying drawings.

Display devices are configured to display moving images and/or still images. A display device may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and a ultra mobile PC (UMPC), as well as the display screen of various products such as a television, a notebook computer, a computer monitor, a digital billboard and various smart devices such as those considered to be Internet of Things (IoT) devices. Examples of display devices include an organic light-emitting display (OLED) device, a liquid-crystal display (LCD) device, a plasma display panel (PDP) device, a field emission display (FED) device, an electrophoretic display (EPD) device, etc.

In the following description, an organic light-emitting display device will be described as an example of a display device. It is, however, to be understood that the present disclosure is not limited thereto.

FIG. 1 is a plan view illustrating a display device according to an exemplary embodiment of the present disclosure.

Referring to FIG. 1, a display device 1 includes a window 20. The display device has a display area DA and a non-display area NDA around the display area DA.

The display area DA is defined as an area for displaying images. The display area DA may have a substantially rectangular shape such as a rectangle or a rectangular shape with the rounded corners as shown in FIG. 1 when viewed from the front. It is, however, to be understood that the present disclosure is not limited thereto. The shape of the display area DA is not limited thereto, and it may have other shapes such as a circle or an ellipse.

The non-display area NDA is disposed to at least partially surround the display area DA. The non-display area NDA may form the edge of the display device 1. In an exemplary embodiment of the present inventive concept, a front camera, an iris recognition sensor, a proximity sensor, etc. may be disposed within the non-display area NDA.

The display area DA may include a sensing area SA1.

Hereinafter, the configuration of the display device 1 will be described in detail with reference to FIGS. 2 and 3.

Figure 2:
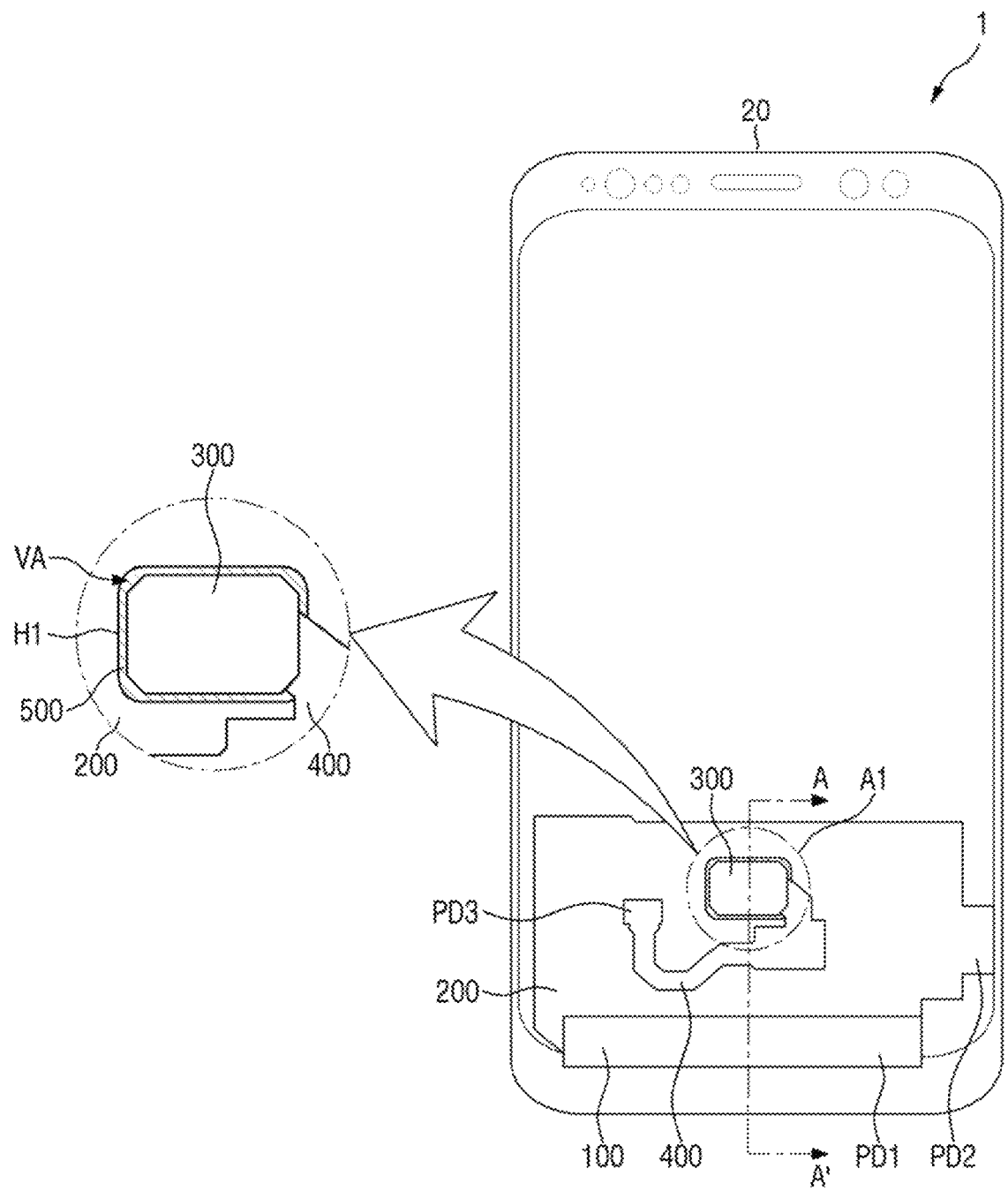
FIG. 2 is a rear view illustrating the display device of FIG. 1.

FIG. 2 is a rear view of the display device of FIG. 1. FIG. 2 shows an enlarged view of area A1. FIG. 3 is a cross-sectional view showing an example of a display device taken along line A-A' of FIG. 2.

Figure 3:
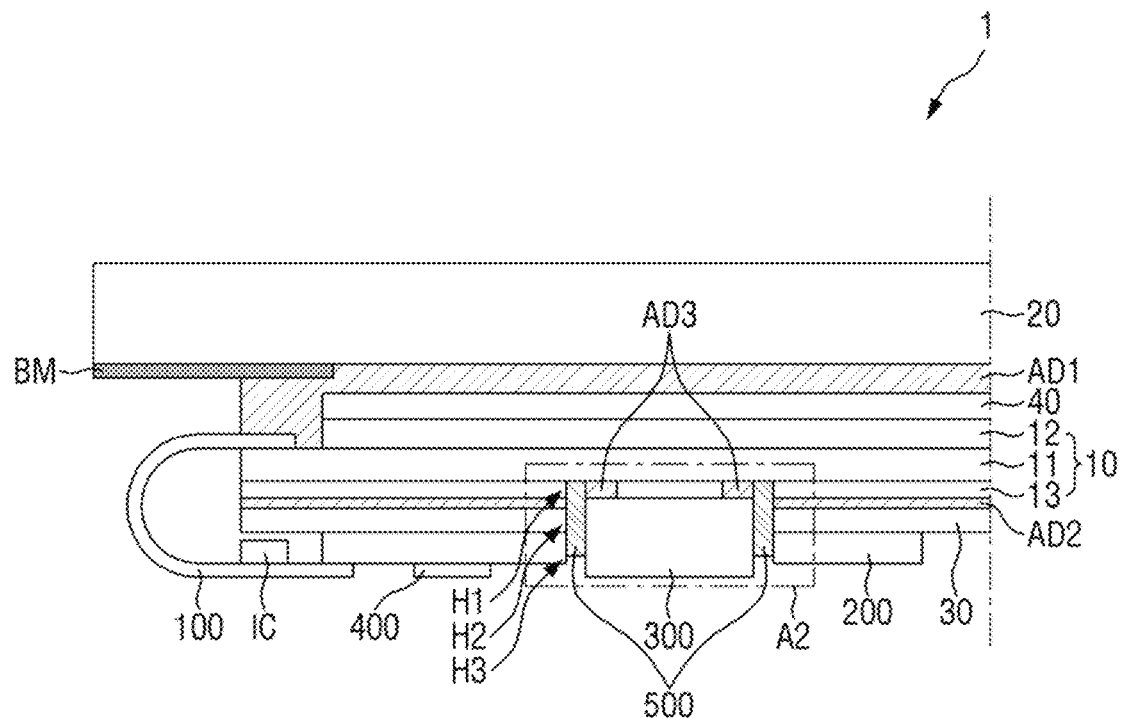
FIG. 3 is a cross-sectional view illustrating an example of a display device taken along line A-A' of FIG. 2.

Referring to FIGS. 2 and 3, the display device 1 includes a display panel 10, a window 20, a panel support sheet 30, an optical sensor 300, a first light-blocking portion 500 (or a light-blocking layer). In addition, the display device 1 may further include a first flexible circuit board 100, a driving circuit board 200 and a second flexible circuit board 400.

The display panel 10 includes a circuit element layer 11 and a display element layer 12. Further, the display panel 10 may further include a protective layer 13.

The circuit element layer 11 includes circuit elements (e.g., transistors, wirings, etc.) disposed on a substrate. The display element layer 12 is disposed on the circuit element layer 100 and includes a plurality of organic light-emitting elements. The substrate may be a rigid substrate made of glass or the like, or a flexible substrate made of polyimide or the like. When the polyimide substrate is used as the substrate, the display panel 10 may be curved, bent, folded or rolled.

The protective layer 13 is disposed behind the circuit element layer 11. The protective layer 13 can protect the display panel 10 from an external impact generated below the display panel 10. The protective layer 13 can protect the display panel 10 from scratches and impacts that may occur during the process of fabricating the display device 1.

The protective layer 13 includes a first hole H1, for example, the first hole H1 is defined in the protective layer 13. The first hole H1 may overlap the sensing area SA1 (see FIG. 1). The first hole H1 passes through the protective layer 13 and penetrates the panel support sheet 30 to expose the lower surface of the display panel 10. When the protective layer 13 includes a light-blocking material, the light emitted from an optical sensor 300, which will be described later, can be transmitted only through the first hole H1. Alternatively, when the protective layer 13 includes no light-blocking material, the first hole H1 may be omitted.

According to some exemplary embodiments of the present disclosure, the protective layer 13 may include a chromic material and a latent heat storage material. The chromic material can change from a first colored state to a second colored state under certain conditions. The latent heat storage material can absorb heat and release the stored heat. The protective layer 13 including the chromic material and the latent heat storage material will be described later with reference to FIGS. 9 and 10.

The window 20 is disposed in front of the display panel 10. The window 20 is disposed in front of the display panel 10 to protect the display panel 10 and to transmit light exiting from the display panel 10.

The window 20 may include a transparent glass or a transparent material such as polyethylene terephthalate, polyvinyl resin and polyester. It is, however, to be understood that the present disclosure is not limited thereto. The type of the window 20 is not particularly limited herein as long as it has a sufficient transmittance to transmit the light exiting from the display panel 10.

The window 20 may at least partially overlap the display panel 10 and may cover the front surface of the display panel 10. The window 20 may be larger than the display panel 10. For example, the window 20 may protrude outwardly from the shorter sides of the display panel 10. The window 20 may protrude from the display panel 10 also at the longer sides of the display device 1. The window 300 may protrude more at the shorter sides than at the longer sides.

The window 20 includes a black matrix BM disposed along the edge of the lower surface. The black matrix BM can be used to prevent the elements thereunder from being seen through the front surface (or the display surface) of the display device 1.

A touch panel 40 (or another form of input sensing panel) may be disposed between the display panel 10 and the window 20. The touch panel 40 may be disposed on the front surface of the display panel 10. For example, the touch panel 40 has substantially the same shape and size as the display panel 10, and may overlap the display panel 10.

In an exemplary embodiment of the present disclosure, the touch panel 40 may be formed directly on the display panel 10. For example, the touch panel 40 can be formed by disposing a touch electrode on a passivation layer of the display panel 10. In an exemplary embodiment of the present disclosure, the touch panel 40 may be fabricated as a separate panel from the display panel 10 and later disposed in front of the display panel 10. Then, the display panel 10 may be coupled to the touch panel 40 by an optically clear adhesive (OCA), an optically clear resin (OCR), or the like.

The touch panel 40 may be coupled to the window 20 by a first adhesive member AD1 such as optically clear adhesive (OCA) and optically clear resin (OCR).

A first flexible circuit board 100 and a driving circuit board 200 may be disposed on one side of the display panel 10 and the touch panel 40. The first flexible circuit board 100 and the driving circuit board 200 may be disposed within the non-display area NDA, adjacent to the sensing area SA1 of the display area DA.

One side of the first flexible circuit board 100 may be connected to the display panel 10, and the other side of the first flexible circuit board 100 may be connected to one side of the driving circuit board 200 (e.g., a first pad portion PD1 where first pads are formed). The first flexible circuit board 100 may electrically connect the display panel 10 with the driving circuit board 200. On the first flexible circuit board 100, a driving chip IC (or an integrated circuit) for driving the display panel 10 may be mounted. In this case, the first flexible circuit board 100 may electrically connect the driving chip IC to the display panel 10.

One side of the first flexible circuit board 100 may be attached to the front surface (or display surface) of the display panel 10, while the other side thereof may be disposed to face the rear surface (or the surface opposite to the display surface) of the display panel 10. For example, the first flexible circuit board 100 may be bent from the front surface 10 toward the rear surface of the display panel 10, and the other side of the first flexible circuit board 100 may be disposed on the rear surface of the panel support sheet 30.

The driving circuit board 200 may include an electronic device for processing a driving signal for driving the display panel 10 (and the touch panel 40). The driving signal generated in the driving circuit board 200 may be transmitted to the driving chip IC and/or the display panel 10 through the first flexible circuit board 100. The driving circuit board 200 may receive a control signal from an external source via one side (e.g., a second pad portion PD2 where second pads are formed), or may output a sensing signal generated from the optical sensor 300 or the like. The driving circuit board 200 may be disposed behind the display panel 10 (or the panel support sheet 30) with a smaller size (or footprint area) than the display panel 10.

The driving circuit board 200 may include a third hole H3. The third hole H3 may overlap the sensing area SA1 (see FIG. 1). The third hole H3 passes through the driver circuit board 200 to expose the lower surface of the display panel 10. The third hole H3 has substantially the same size as the first hole H1 of the protective layer 13 (and the second hole H2 of the panel support sheet 30 described later), and may be substantially aligned with the first hole H1.

The panel support sheet 30 may be disposed behind the display panel 10. The panel support sheet 30 has substantially the same size as the display panel 10 and may overlap the display panel 10. The side surfaces of the panel support sheet 30 may be, but is not limited to being, aligned with the side surfaces of the display panel 10. The panel support sheet 30 may be attached to the lower surface of the display panel 10 by a second adhesive member AD2.

The panel support sheet 30 may be configured to perform light-blocking function, heat dissipation function, electromagnetic wave shielding function, pattern hiding function, grounding function, buffering function, strength enhancing function and/or digitizing function, etc. The panel support sheet 30 may include a functional layer having at least one of the above-described functions. The functional layer may be provided in a variety of forms such as a layer, a film, a sheet, a plate and a panel.

The panel support sheet 30 may include one or more functional layers. When the panel support sheet 30 includes a plurality of functional layers, the functional layers may be stacked on one another such that they overlap with one another. The functional layers may be stacked directly on one another or may be disposed with a coupling layer.

The panel support sheet 30 may include a first functional layer 31 (see FIG. 4) and a second functional layer 32 (see FIG. 4) stacked on one another. It is to be understood that this is merely illustrative and the panel support sheet 30 may include three or more functional layers.

The first functional layer 31 may be a buffer member that mitigates an external impact. For example, the first functional layer 31 absorbs a part of the impact applied to the display device 1, thereby preventing the display device 1 from being damaged by the impact.

The first functional layer 31 may be formed of a polymer resin such as polyurethane, polycarbonate, polypropylene and polyethylene, or may be formed of a sponge formed by foaming a rubber liquid, a urethane-based material or an acrylic-based material.

The second functional layer 32 may perform a digitizer function. The digitizer is one of input means, which receives the position information indicated by a user on the screen, unlike the input means such as a keyboard and a mouse. For example, the second functional layer 32 may recognize the movement of a stylus pen and convert it into a digital signal.

The panel support sheet 30 includes a second hole H2. The second hole H2 may overlap the sensing area SA1 (see FIG. 1). The second hole H2 penetrates the panel support sheet 30 to expose the lower surface of the display panel 10. The second hole H2 may have substantially the same size as the first hole H1 of the protective layer 13, and may be aligned with the first hole H1. For example, the inner side wall of the panel support sheet 30 by the second hole H2 may be located on the inner side wall of the protective layer 13 (e.g., the inner side wall of the protective layer 13 by the first hole H1) and may be located on the same plane.

The optical sensor 300 is disposed in the second hole H2. The optical sensor 300 may directly face the display panel 10. The optical sensor 300 may be, for example, a fingerprint recognition sensor using infrared rays. It is, however, to be understood that the present disclosure is not limited thereto. Any sensor may be employed as the optical sensor 300 as long as it can perform the sensing function using infrared rays.

The optical sensor 300 may be coupled with the display panel 30 by a third adhesive member AD3 such as optically clear adhesive (OCA) and optically clear resin (OCR). The third adhesive member AD3 may be disposed along the edge of the upper surface (or the sensing surface that emits and receives light) of the optical sensor 300, to increase the transmittance of the light emitted from the optical sensor 300 and the reflected light.

Referring to FIG. 2, the optical sensor 300 may be secured to the second flexible circuit board 400. The optical sensor 300 may be secured to the second flexible circuit board 400 by, for example, soldering. As shown in FIG. 2, the second flexible circuit board 400 may be extended to one side of the optical sensor 300 on the lower surface of the driving circuit board 200, and may be connected to the driving circuit board 200. For example, the driving circuit board 200 may include a third pad portion PD3 positioned in a particular region, and the second flexible circuit board 400 may be connected to a third pad portion PD3 of the driving circuit board 200.

The optical sensor 300 may be spaced apart from the inner wall of the panel support sheet 30 by a predetermined distance. For example, the size of the second hole H2 formed in the panel support sheet 30 may be larger than the size of the optical sensor 300.

The first light-blocking portion 500 may be disposed in a void area VA that is between the optical sensor 300 and the panel support sheet 30 at the second hole H2. The void area VA may be filled with the first light-blocking portion 500 after the optical sensor 300 is disposed in the second hole H2. The first light-blocking portion 500 can absorb or block the light transmitted through the void area VA. For example, the first light-blocking portion 500 may include a color dye or an opaque dye. The color dye may include synthetic dyes such as an anthraquinone-based synthetic dye, an azo-based synthetic dyes a methine-based synthetic dye, a quinoline-based synthetic dye, a perylene-based synthetic dye, an azine-based synthetic dye and a nigrosine dye with excellent light-blocking properties, or may include an organic dye such as a phthalocyanine-based dye, a dioxazine-based dyes and a perylene-based dye with excellent shielding properties on the visible range. Further, the first light-blocking portion 500 has an adhesive property, and can secure the optical sensor 300 to the panel support sheet 30. For example, the first light-blocking portion 500 may be a glue or a resin. It is to be understood that this is merely illustrative and the first light-blocking portion 500 is not limited thereto. The material of the first light-blocking portion 500 is not particularly limited as long as it can block light and has adhesive properties.

In an exemplary embodiment of the present disclosure, the first light-blocking portion 500 may be disposed exclusively within a part of the void area VA. As shown in FIG. 2, the optical sensor 300 is connected to the driving circuit board 200 through the second flexible circuit board 400, and accordingly the second flexible circuit board 400 may overlap with a part of the void area VA. Therefore, the overlapped part of the void area VA (e.g., the part of the void area VA that overlaps with the second flexible circuit board 400) can be shielded by the second flexible circuit board 400. Accordingly, the first light-blocking portion 500 is disposed exclusively within the non-overlapped part of the void area VA (e.g., the part of the void area VA that does not overlap with the second flexible circuit board 400), to thereby absorb or block the light transmitted through the non-overlapped part of the void area VA.

Figure 4:
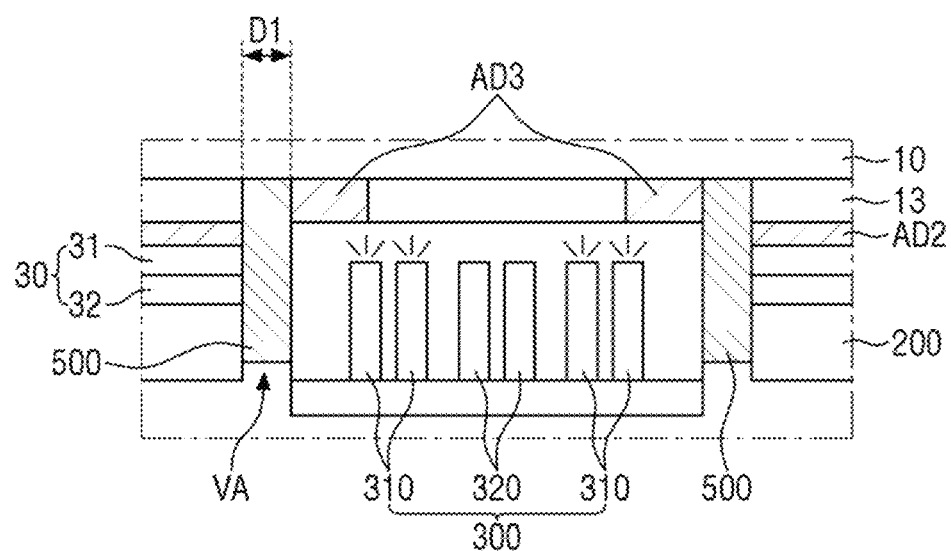
FIG. 4 is an enlarged, cross-sectional view illustrating area A2 of FIG. 3.

FIG. 4 is an enlarged, cross-sectional view of area A2 of FIG. 3.

Referring to FIGS. 3 and 4, the optical sensor 300 may be spaced apart from the inner side wall of the panel support sheet 30 by a predetermined distance. The first distance D1 between the optical sensor 300 and the inner wall of the panel support sheet 30 may be approximately 0.1 mm to approximately 0.5 mm.

If the first distance D1 is 0.1 mm or more, preferably 0.2 mm or more, the optical sensor 300 does not hit the panel support sheet 30 directly, thereby preventing the optical sensor 300 from being damaged. When the first distance D1 is 0.5 mm or less, preferably 0.3 mm or less, it is possible to produce the display device 1 which is sufficiently slim and small.

The optical sensor 300 may include light-emitting parts 310 for emitting infrared rays and sensing parts 320 for receiving and sensing the infrared rays. The optical sensor 300 may analyze the unique pattern of a target object by measuring the time that it takes for the infrared rays emitted from the light-emitting parts 310 to be received by the sensing parts 320.

For example, the fingerprint of a finger includes protruding ridges and depressed valleys. The time that it takes for the infrared rays L1 emitted from the light-emitting parts 310 to be received by the sensing parts 320 varies depending on whether it is reflected off either the ridges or the valleys. Accordingly, it is possible to analyze the unique pattern of a fingerprint by measuring the time at which the infrared rays are received.

Figure 5:
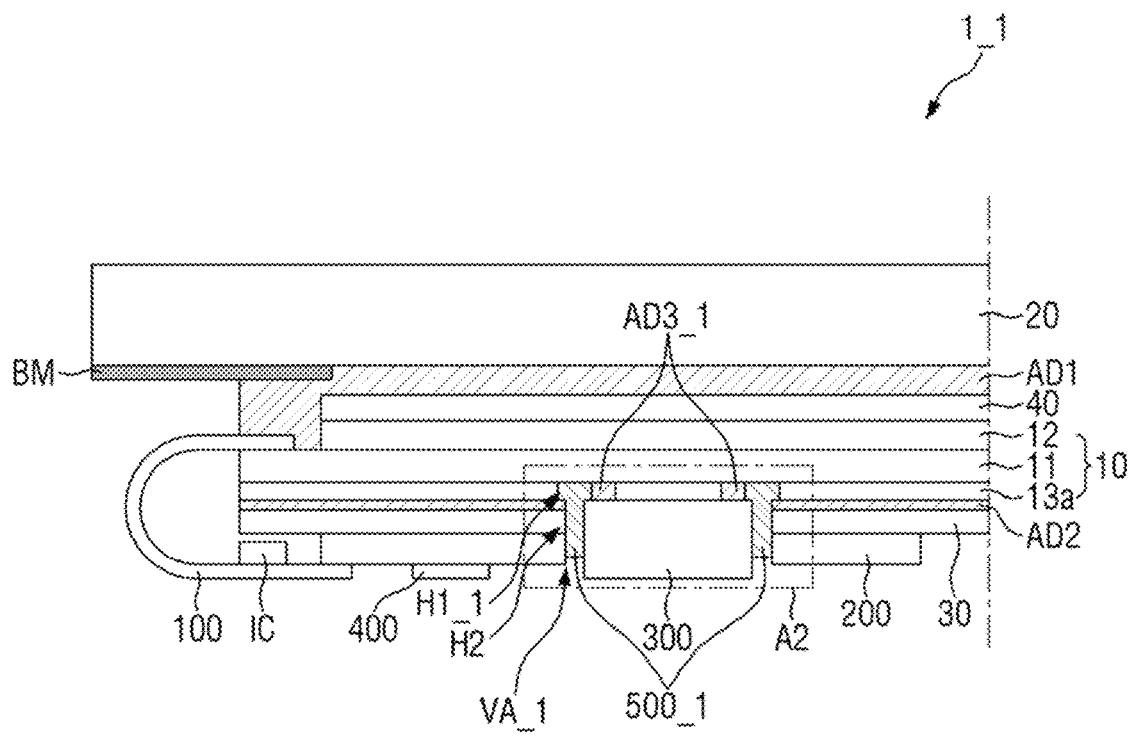
FIG. 5 is a cross-sectional view illustrating a display device according to an exemplary embodiment of the present disclosure.
Figure 6:
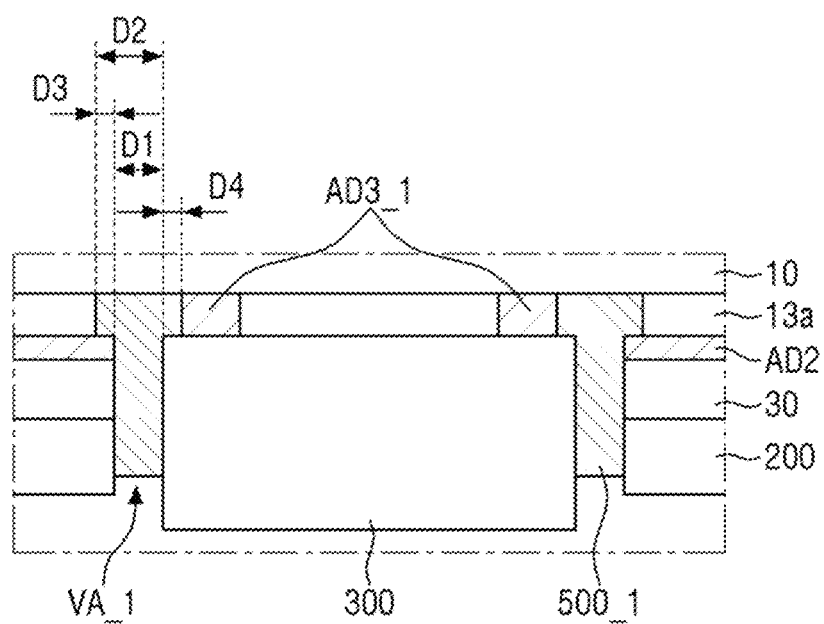
FIG. 6 is an enlarged view illustrating area A2 in FIG. 5.

FIG. 5 is a cross-sectional view illustrating a display device according to an exemplary embodiment of the present disclosure. FIG. 6 is an enlarged view of area A2 in FIG. 5.

Referring to FIG. 5, a display device 1_1 is different from the display device 1 of FIG. 3 in that the former comprises a protective layer 13a, a third adhesive member AD3_1 and a first light-blocking portion 500_1.

The display device 1_1 is substantially identical to the display device 1 except for the protective layer 13a and the first light-blocking portion 500_1; and, therefore, the omitted description of the other elements may be understood to be at least similar to corresponding elements that have already been described.

The protective layer 13a is substantially identical to the protective layer 13 described above with reference to FIG. 3 except for a first hole H1_1; and, therefore, the omitted description of the other elements may be understood to be at least similar to corresponding elements that have already been described.

The first hole H1_1 of the protective layer 13a may be larger than the second hole H2 of the panel support sheet 30. Then, the inner wall of the protective layer 13a may be spaced apart from the optical sensor 300 by a distance greater than the size inner wall of the panel support sheet 30. For example, the second distance D2 from the outer side surface of the optical sensor 300 to the protective layer 13a may be greater than the first distance D1 from the outer side surface of the optical sensor 300 to the panel support sheet 30 by a third distance D3. The third distance D3 may be, but is not limited to, 0.1 mm to 0.2 mm.

Similarly, the third adhesive member AD3_1 may be interposed between the optical sensor 30 and the display panel 10 such that the outer side surface of the third adhesive member AD3_1 may be located more to the inside than the outer side surface of the optical sensor 30 (closer to the center of the area of the third adhesive member AD3_1). For example, the third adhesive member AD3_1 may be located more to the inside by a fourth distance D4 than the outer side surface of the optical sensor 300. The fourth distance D4 may be, but is not limited to, 0.1 mm to 0.2 mm.

Accordingly, as shown in FIG. 6, a void area VA_1 having the cross-section in "T" shape may be formed between the panel support sheet 30 and the optical sensor 300.

The void area VA_1 may be filled with the first light-blocking portion 500_1 and may have a cross-section in the shape of a "T" as shown in FIG. 5.

Since the void area VA_1 has the cross section having a "T" shape, the void area VA_1 may be filled with the first light-blocking portion 500_1 up to the inner corners (e.g., the portion adjacent to the protective layer 13a and the portion adjacent to the third adhesive member AD3_1). For example, when the first light-blocking portion 500_1 is a liquid resin and the void area VA_1 is filled with it, the first light-blocking portion 500_1 is extended from the lower surface of the display panel 10 to the inner corners of the void area VA_1. Even if the inner corners (e.g., the corner where the outer side surface of the protective layer 13a meets the lower surface of the display panel 10) of the void area VA_1 is not filled with the first light-blocking portion 500_1 or is insufficiently filled with it, the inner corners of the first light-blocking portion 500_1 may be hidden by the panel support sheet 30 and/or the optical sensor 300. For example, when the panel support sheet 30 has a light-blocking function, the part of the display panel 10 overlapping with the panel support sheet 30 might not be seen through the front surface of the display device 1. Similarly, the part of the display panel 300 overlapping with the optical sensor 300 might not be seen through the front surface of the display device 1.

Figure 7:
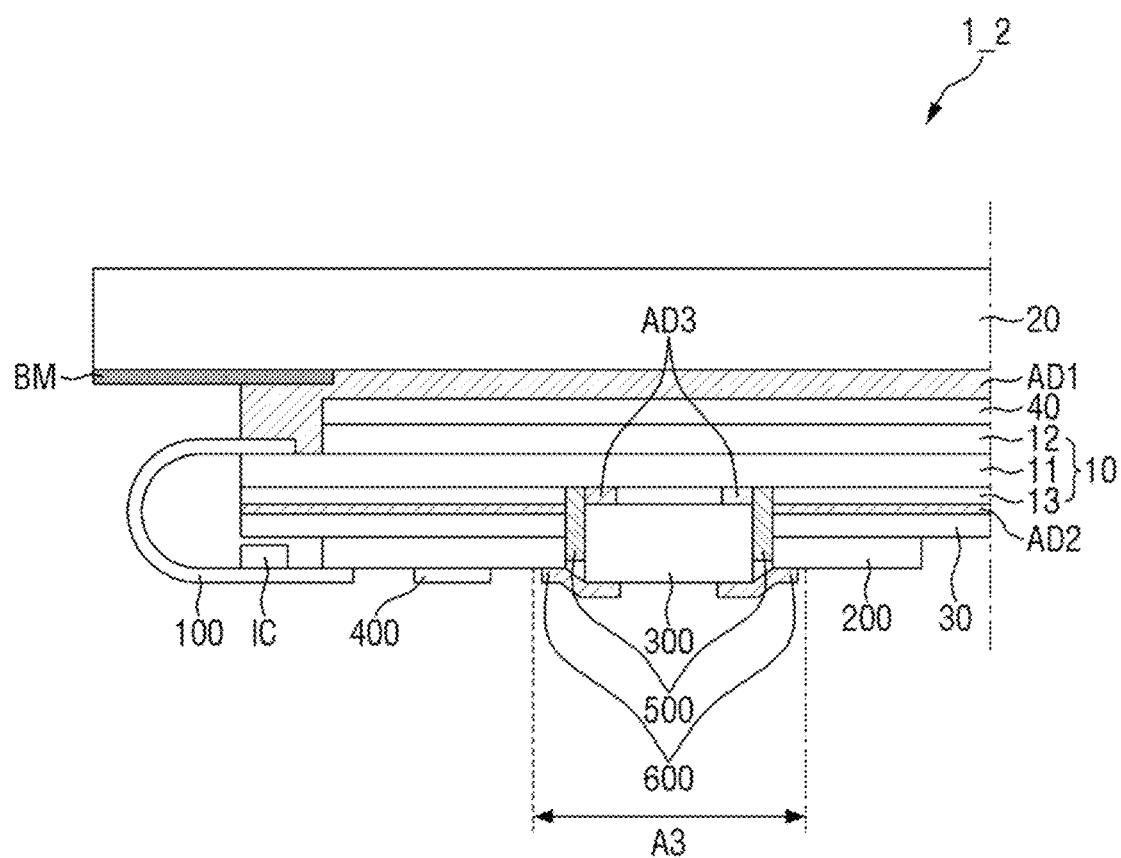
FIG. 7 is a cross-sectional view illustrating a display device according to an exemplary embodiment of the present disclosure.
Figure 8:
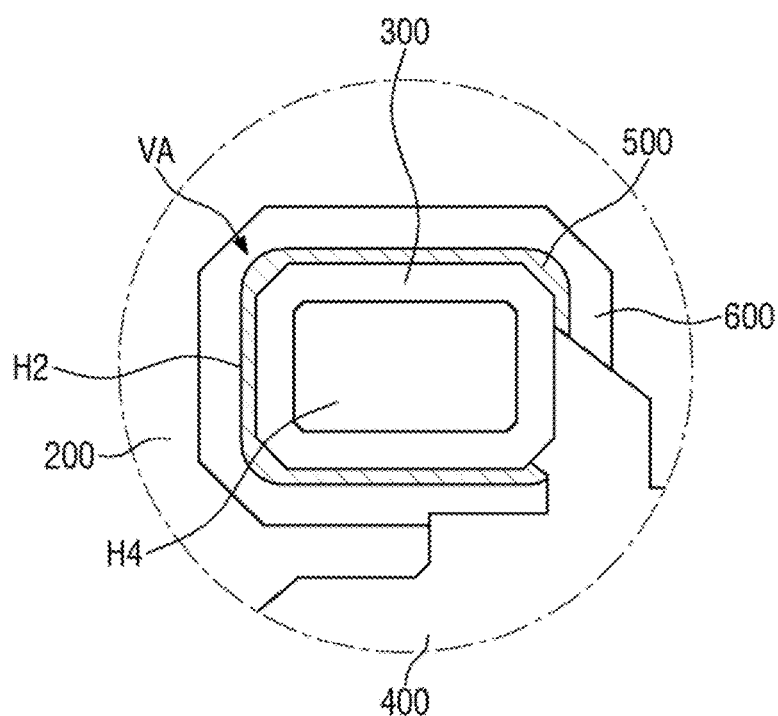
FIG. 8 is a rear view illustrating an example of a portion of a display device, corresponding to area A3 in FIG. 7.

FIG. 7 is a cross-sectional view of a display device according to an exemplary embodiment of the present disclosure. FIG. 7 is a cross-sectional view of a display device, which is the counterpart of FIG. 3. FIG. 8 is a rear view showing an example of a portion of a display device, corresponding to area A3 in FIG. 7. The area A3 of FIG. 7 corresponds to the area A1 of FIG. 2.

A display device 1_2 shown in FIGS. 2, 3 and 7 is different from the display device 1 of FIG. 3 in that the display device 1_2 further includes a second light-blocking portion 600. The display device 1_2 is substantially identical to the display device 1 of FIG. 3 except for the second light-blocking portion 600; and, therefore, the redundant description will be omitted.

The second light-blocking portion 600 is disposed under the driving circuit board 200 and the optical sensor 300 and may cover the void area VA (see FIG. 2).

The second light-blocking portion 600 may be a single-sided adhesive film. The second light-blocking portion 600 may have an adhesive upper surface, and the second light-blocking portion 600 may be attached to the lower surface of the driving circuit board 200 and the lower surface of the optical sensor 300. The second light-blocking portion 600 may support the optical sensor 300 and may be secured to the display panel 10.

The second light-blocking portion 600 may include a light-blocking material. For example, the second light-blocking portion 600 may be a light-blocking tape. The second light-blocking portion 600 may block the light transmitting the void area VA (see FIG. 2) together with the first light-blocking portion 500. If the thickness of the optical sensor 300, the thickness of the panel support sheet 30, etc. are reduced, the thickness of the first light-blocking portion 500 may also be reduced. In this case, a part of the light transmits the first light-blocking portion 500, such that the optical sensor 300 may be seen by a user through the front surface of the display panel 10. Therefore, by disposing the second light-blocking portion 600 to cover the void area VA, it is possible to more effectively hide the optical sensor 300 from being seen by a user.

As shown in FIG. 8, the second light-blocking portion 600 may have a substantially rectangular shape conforming to the optical sensor 300 (or the second hole H2 of the panel support sheet 30) when viewed from the front. The second light-blocking portion 600 may include a fourth hole H4 formed in line with the center of the area. Heat generated in the optical sensor 300 may be discharged or delivered behind the optical sensor 300 through the fourth hole H4.

The second light-blocking portion 600 may be formed exclusively within the non-overlapped part of the void area VA (e.g., the part of the void area VA that does not overlap with the second flexible circuit board 400), similarly to the first light-blocking portion 500.

As described above with reference to FIGS. 7 and 8, the display device 1_1 further includes the second light-blocking portion 600 so that the optical sensor 300 can be more stably secured to the display panel 10, and thus it is possible to hide the optical sensor 300 from being seen through the front surface of the display panel 10.

Figure 9:
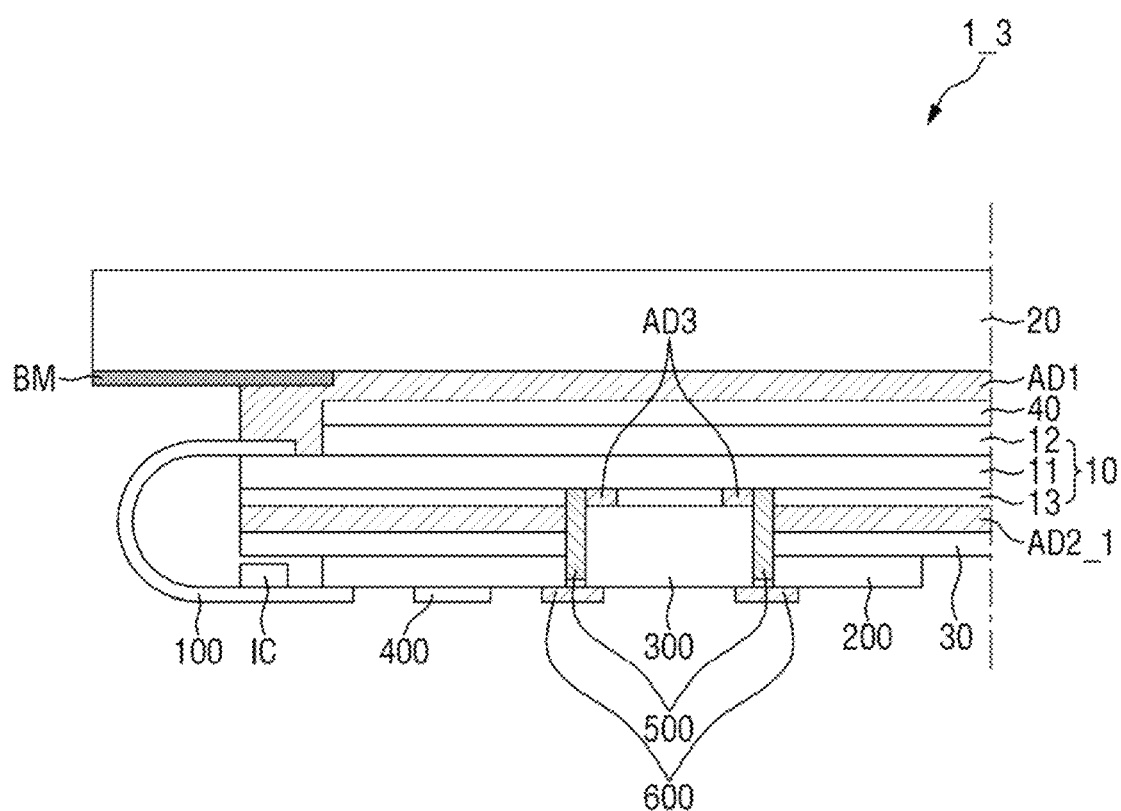
FIG. 9 is a cross-sectional view illustrating a display device according to an exemplary embodiment of the present disclosure.

FIG. 9 is a cross-sectional view of a display device according to an exemplary embodiment of the present disclosure.

Referring to FIGS. 7 and 9, a display device 1_3 is different from the display device 1_2 of FIG. 7 in that the former comprises a second adhesive member AD2_1.

The second adhesive member AD2_1 may be disposed between the display panel 10 and the panel support sheet 30 to secure the panel support sheet 30 to the display panel 10.

The thickness of the second adhesive member AD2_1 may be larger than the thickness of the second adhesive member AD2 shown in FIG. 7. As shown in FIG. 7, when the optical sensor 300 is thicker than the panel support sheet 30 (and the driving circuit board 200), there may be a level difference between the lower surface of the optical sensor 300 and the lower surface of the driving circuit board 200. When this happens, at least a part of the second light-blocking portion 600 may be bent along the level difference, and stress may be applied to the bent portion. Further, even if the void area VA is filled with the first light-blocking portion 500 down to the lower surface of the driving circuit board 200, there is an empty space due to the level difference.

Accordingly, as shown in FIG. 9, the thickness of the second adhesive member AD2_1 may be adjusted (for example, to be relatively thick) so that the lower surface of the optical sensor 300 and the lower surface of the driving circuit board 200 may be located on the same plane or may become even. To do so, the second light-blocking portion 600 may have a flat shape. In addition, when the void area VA is filled with the first light-blocking portion 500 down to the lower surface of the driving circuit board 200, the second light-blocking portion 600 is in contact with the first light-blocking portion 500, such that the second light-blocking portion 600 can be more reliably coupled with it, and the optical sensor 300 can be more stably secured to the display panel 10.

Figure 10:
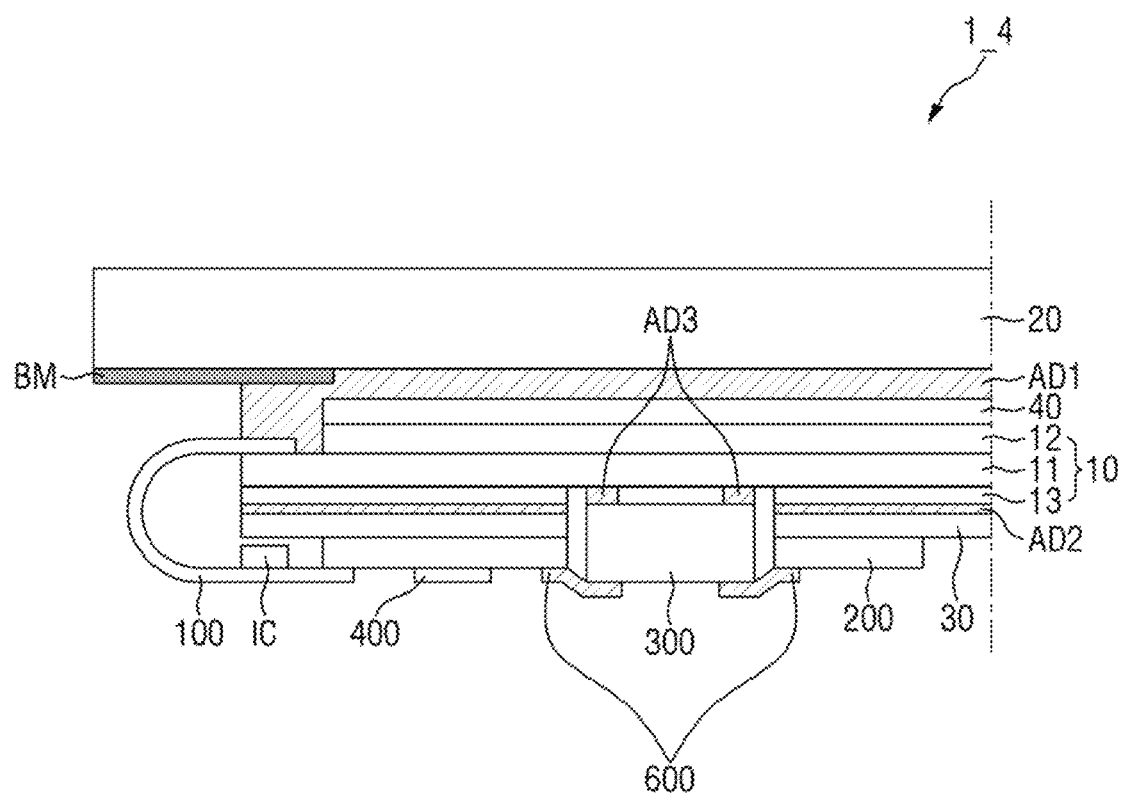
FIG. 10 is a cross-sectional view illustrating a display device according to an exemplary embodiment of the present disclosure.

FIG. 10 is a cross-sectional view of a display device according to an exemplary embodiment of the present disclosure. FIG. 10 is a cross-sectional view of a display device.

Referring to FIGS. 7 and 10, the display device 1_4 is different from the display device 1_2 of FIG. 7 in that the display device 1_4 does not include the first light-blocking portion 500.

By adjusting the thickness, the material and the like of the second light-blocking portion 600, the second light-blocking portion 600 can block at least a sufficient portion of the light. Thus, the display device 1_4 can sufficiently block the light passing through the void area VA (see FIG. 2) exclusively with the second light-blocking portion 600.

As the process of forming the first light-blocking portion 500 (for example, coating and curing) can be omitted from the process of fabricating the display device 1_4, the fabricating process can become simpler.

Although there is a level difference between the lower surface of the optical sensor 300 and the lower surface of the driving circuit board 200 in FIG. 10, the present disclosure is not limited thereto. The display device 1_4 includes the second adhesive member AD2_1 described above with reference to FIG. 9, and the lower surface of the optical sensor 300 and the lower surface of the driver circuit board 200 may be located on the same plane.

Figure 11:
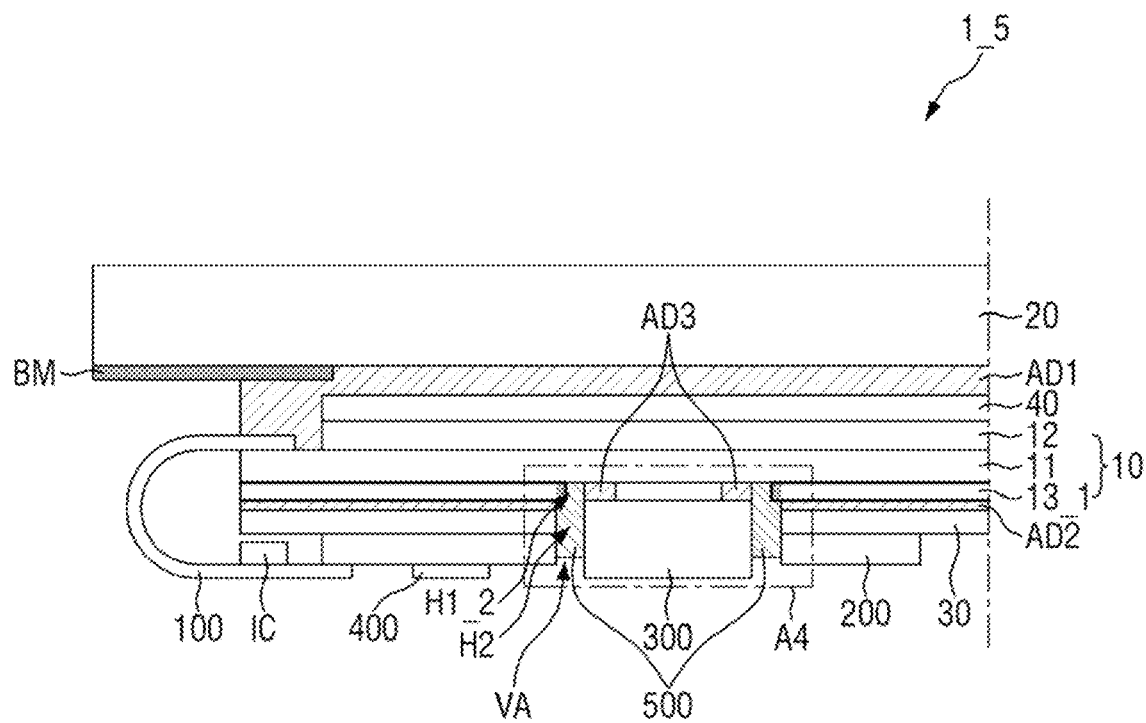
FIG. 11 is a cross-sectional view illustrating a display device according to an exemplary embodiment of the present disclosure.
Figure 12:
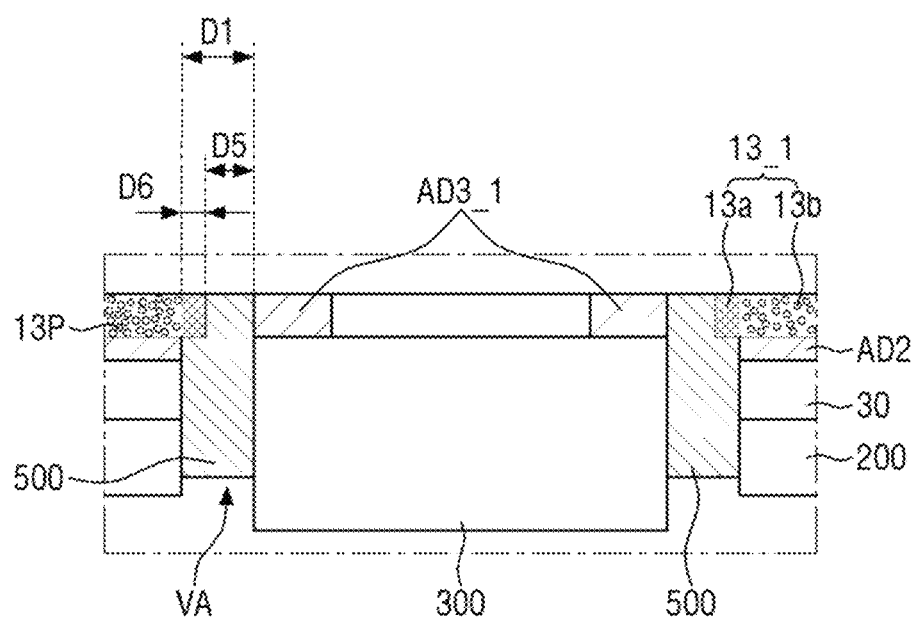
FIG. 12 is an enlarged view of area A4 of FIG. 11.
Figure 13:
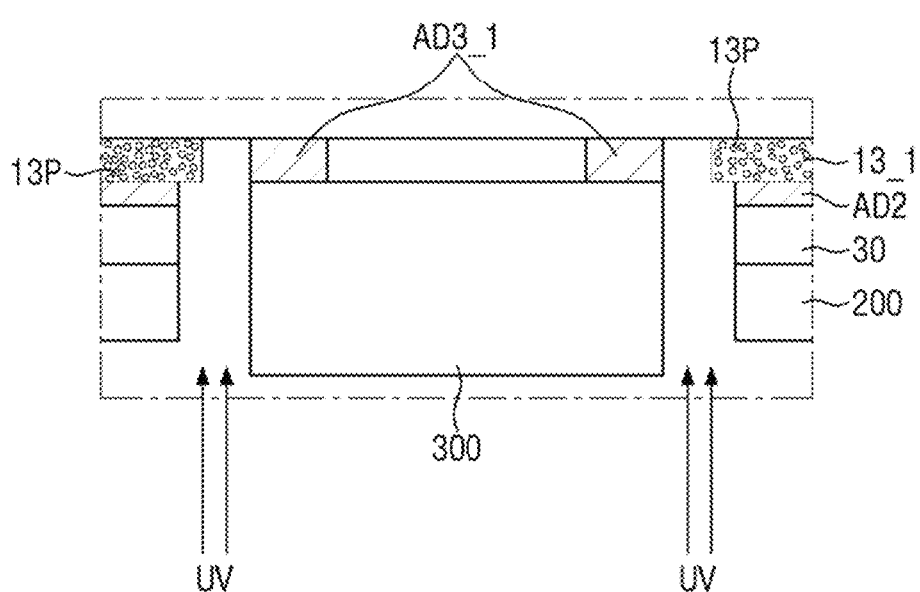
FIG. 13 is a view illustrating a process of forming a protective layer included in the display device of FIG. 11.

FIG. 11 is a cross-sectional view of a display device according to an exemplary embodiment of the present disclosure. FIG. 11 is a cross-sectional view of a display device, which is the counterpart of FIG. 3. FIG. 12 is an enlarged view of area A4 of FIG. 11. FIG. 13 is a view showing a process of forming a protective layer included in the display device of FIG. 11. FIG. 13 is the cross-sectional view which is the counterpart of FIG. 12.

Referring to FIGS. 3 and 11, a display device 1_5 is different from the display device 1 of FIG. 3 in that the former includes a protective layer 13_1. The display device 1_5 is substantially identical to the display device 1 of FIG. 3 except the protective layer 13_1; and, therefore, the omitted description of the other elements may be understood to be at least similar to corresponding elements that have already been described.

The protective layer 13_1 may include a first hole H1_2. As shown in FIG. 12, the first hole H1_2 of the protective layer 13_1 has a size that is larger than that of the optical sensor 300 and is smaller than the second hole H2 of the panel support sheet 30 (or the driving circuit board 200). In this case, in the void area VA, the protective layer 13_1 can be exposed through the second hole H1.

For example, the fifth distance D5 between the inner wall of the protective layer 13_1 and the optical sensor 300 may be approximately 0.1 mm to 0.2 mm. The first distance D1 between the panel support sheet 30 and the inner wall of the optical sensor 300 may be approximately 0.33 mm to 0.5 mm. In the void area VA, the protective layer 13_1 is exposed by a sixth distance D6. For example, the sixth distance D6 may be approximately 0.1 mm to 0.4 mm.

The protective layer 13_1 may include a chromic material 13P. The protective layer 13_1 may be formed via a screen printing process. For example, the protective layer 13_1 may be formed by screen printing a composition containing a heat curing agent, a fine silica powder, a silicone antifoaming agent, an antistatic agent, a petroleum naphtha solvent, diethylene glycol monoethyl ethylacetate, etc. on the rear surface of the display panel 10, and then by perform a thermosetting process on it. The protective layer 13_1 may be printed on the entire rear surface of the display panel 10, and the protective layer 13_1 may cover the entire rear surface of the display panel 10. The thickness of the protective layer 13_1 may be 8 μm to 14 μm.

The composition for forming the protective layer 13_1 may further contain a chromic raw material. The chromic raw material may be a material that changes from a colorless state to a colored state in response to light, heat or current. The chromic raw material may spread over the entire protective layer 13_1, and the color of the protective layer 13_1 may be determined according to the changed color of the chromic raw material.

The protective layer 13_1 may contain a photochromic raw material in which the molecular structure is changed by exposure so as to become a particular color. For example, the protective layer 13_1 may include a photochromic raw material such as spiropyran, fulgide and/or amino azobenzene. Its color may be changed when it is exposed to light of a particular wavelength. As shown in FIG. 11, the color of the protective layer 13_1 may be changed when it is exposed to ultraviolet (UV) rays. For example, the color of the first portion 13a exposed to ultraviolet rays may be changed, whereas the color of the second portion 13b not exposed to ultraviolet rays might not be changed.

It is, however, to be understood that the present disclosure is not limited thereto. The protective layer 13_1 may contain an electrochromic material such as tungsten trioxide and vigorous. When the current of a certain level is applied, the protective layer 13_1 may change from the colorless state to the colored state.

In addition, the protective layer 13_1 may contain a thermalchromic material that can change from a first colored state to a second colored state under processing conditions above a particular temperature. For example, the color of the protective layer 13_1 may be changed being heated above a particular temperature.

Once the protective layer 13_1 is formed on the other surface of the display panel 10, e.g., once it is cured, the protective layer 13_1 may be transparent. It is to be noted that the color of the protective layer 13_1 may be changed after an auto trace test (ATT) process for checking whether the integrated circuit is normally mounted during the process of fabricating the display device 1. After the color of the protective layer 13_1 is changed, it can be used to block the light emitted from the display panel 10 from leaking below the display panel 10. For example, the protective layer 13_1 might not only protect the display panel 10 from external impact generated during the processes but also block the light emitted from the display panel 10.

In an exemplary embodiment of the present disclosure, the composition forming the protective layer 13_1 may contain a latent heat storage pigment. The latent heat storage pigment may have a core-shell structure in which a phase change material (PCM) is microencapsulated in a polymer (Pm). For example, the polymer may surround the phase change material and may separate the phase change material from an external material and protect the phase change material. The phase change material may include hydrocarbon, wax such as alkane mixture, inorganic materials such as hydrate salt, carbon nanotubes, graphite, and/or graphene. The phase of the phase change material is changed from a solid state to a liquid state as the temperature increases, and accordingly, the phase change material thereby absorbs heat.

For example, the phase of the phase change material may be changed to a liquid phase by the heat generated when the display device 1 is in use, and may absorb ambient heat. The latent heat storage pigment absorbs the temperature increased by the use of the display device 1, and then may release heat when the display device is not in use. In this manner, the protective layer 13_1 can provide additional heat dissipation by using the latent heat storage pigment.

The shape of the latent heat storage pigment may be, but is not limited to being, circular. It may have irregular shape. The latent heat storage pigments may also have different colors depending on the polymer forming the shell. The latent heat storage pigment may be formed of a black-colored polymer. For example, as the shell of the latent heat storage pigment is formed in black, the light-blocking properties of the protective layer 13_1 can be further increased.

As the protective layer 13_1 can block light by including a chromatic material, the display device 1 might not include additional light-blocking sheet (e.g., a light-blocking sheet or light-blocking layer included in the panel support sheet 30). For example, since light-blocking sheet includes a light-blocking layer, adhesive layers, etc., it is thicker than the protective layer 13_1, which is screen printed. As a result, the display device 1 can become smaller, lighter and thinner.

As described above with reference to FIGS. 11 to 13, the protective layer 13_1 has the first hole H1_2 smaller than the second hole H2 of the panel support sheet 30, and may contain a photochromic raw material. The color of a part of the protective layer 13_1 exposed through the second hole H2 in the void area VA may be changed when it is exposed to ultraviolet rays, such that it can block light. In order to produce a smaller and thinner display device 1, the protective layer 13_1 may be employed so that the void area VA can be shielded. The part of the void area VA that is not shielded by the protective layer 13_1 may be shielded by the first light-blocking portion 500.

Figure 14:
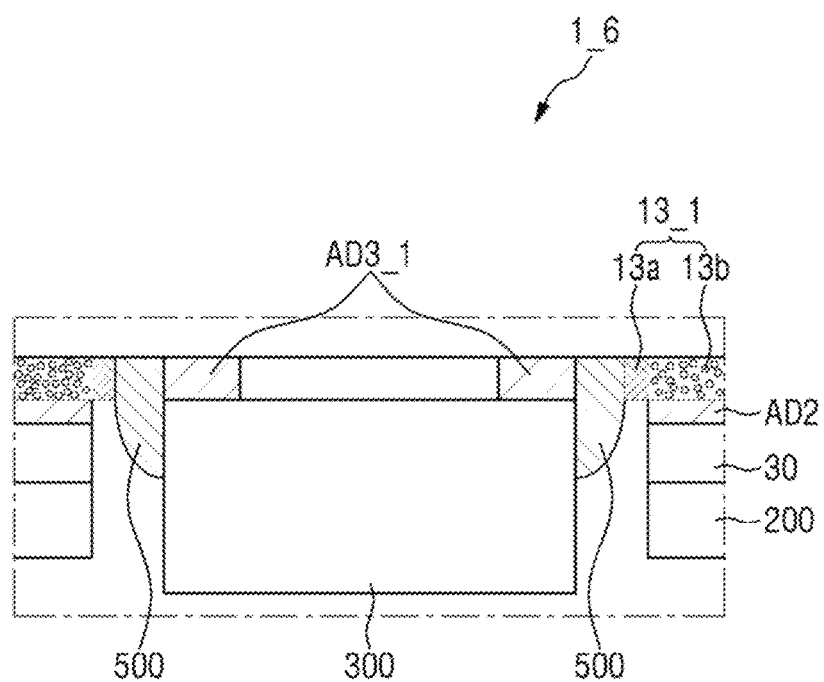
FIGS. 14 and 15 are cross-sectional views illustrating display devices according to exemplary embodiments of the present disclosure.
Figure 15:
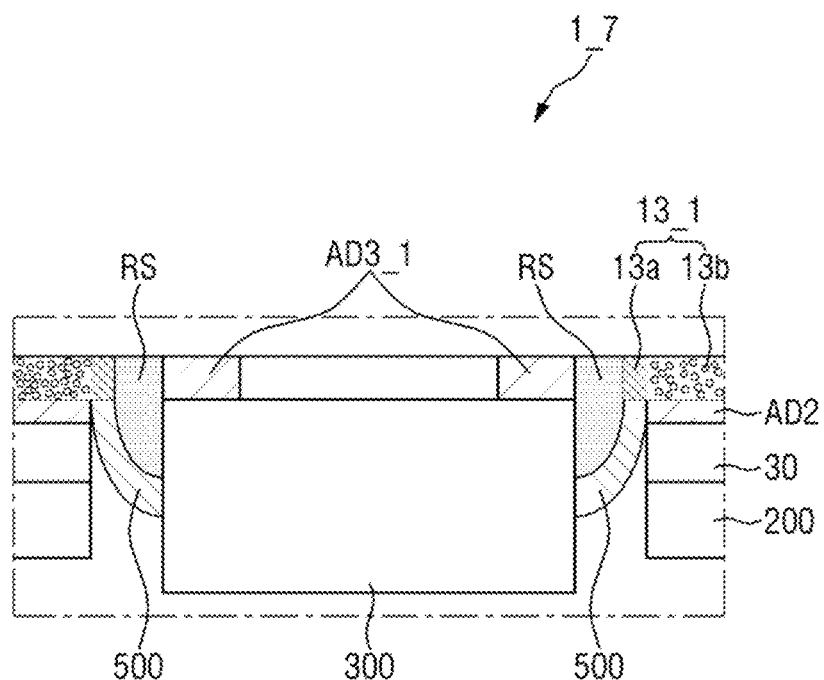

FIGS. 14 and 15 are cross-sectional views of display devices according to exemplary embodiments of the present disclosure. FIGS. 14 and 15 are cross-sectional views.

Referring to FIGS. 12 and 14, a display device 1_6 may be substantially identical to the display device 1_5 (see FIG. 11) of FIG. 12 except for the location of the first light-blocking portion 500.

As shown in FIG. 14, the first light-blocking portion 500 may be disposed between the inner wall of the protective layer 13_1 and the optical sensor 300 and might not overlap with the protective layer 13_1.

The protective layer 13_1 may contain a photochromic raw material whose color is changed when it is exposed to ultraviolet rays. After the first light-blocking portion 500 is applied, the display device 1_5 may be exposed to ultraviolet rays. When the first light-blocking portion 500 overlaps or covers the protective layer 13_1, the ultraviolet rays might not reach the first portion 13a of the protective layer 13_1. Therefore, the first light-blocking portion 500 may be disposed so as not to overlap with the protective layer 13_1.

Referring to FIGS. 12 and 15, a display device 1_7 is different from the display device 1_5 of FIG. 9 in that the former includes an adhesive RS.

The adhesive RS may be made of a transparent resin that transmits light. The transparent adhesive RS may be applied or disposed between the inner wall of the protective layer 13_1 and the optical sensor 300. Although the adhesive RS is shown as not overlapping with the protective layer 13_1 in FIG. 15, the present disclosure is not limited thereto. The adhesive RS may overlap with the protective layer 13_1. After the adhesive RS is applied, the display device 1_7 may be exposed to ultraviolet rays. Then, the color of the first portion 13a of the protective layer 13_1 is changed, and the adhesive RS is hardened, so that the optical sensor 300 can be secured to the display panel 10.

After display device 1_7 is irradiated by the ultra violet rays, the first light-blocking portion 500 may be applied or disposed in the void area VA (see FIG. 2).

Although the adhesive RS is a transparent resin in the example shown in FIG. 15 in order to illustrate that the adhesive RS is different from the first light-blocking portion 500, the present disclosure is not limited thereto. For example, the display device 1_7 may include a colored (or opaque) adhesive instead of a transparent resin, and the colored adhesive might not overlap with the protective layer 13_1.

Figure 16:
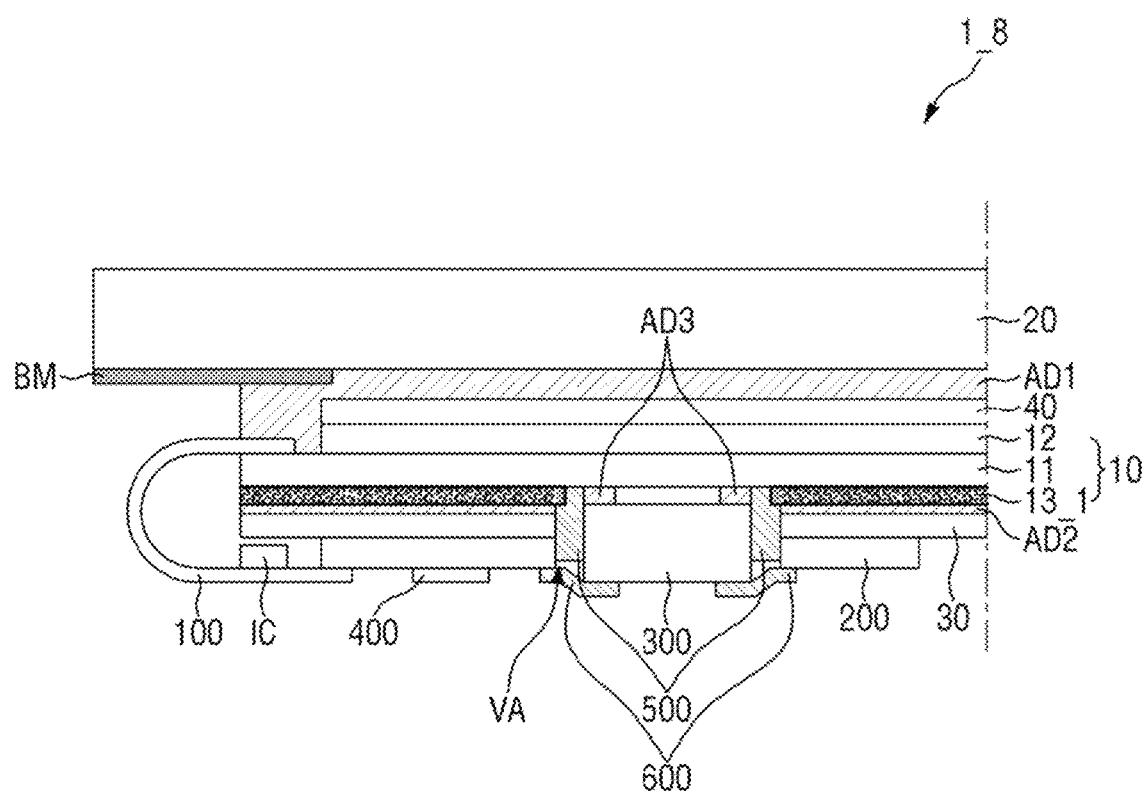
FIGS. 16 and 17 are cross-sectional views illustrating display devices according to exemplary embodiments of the present disclosure.
Figure 17:
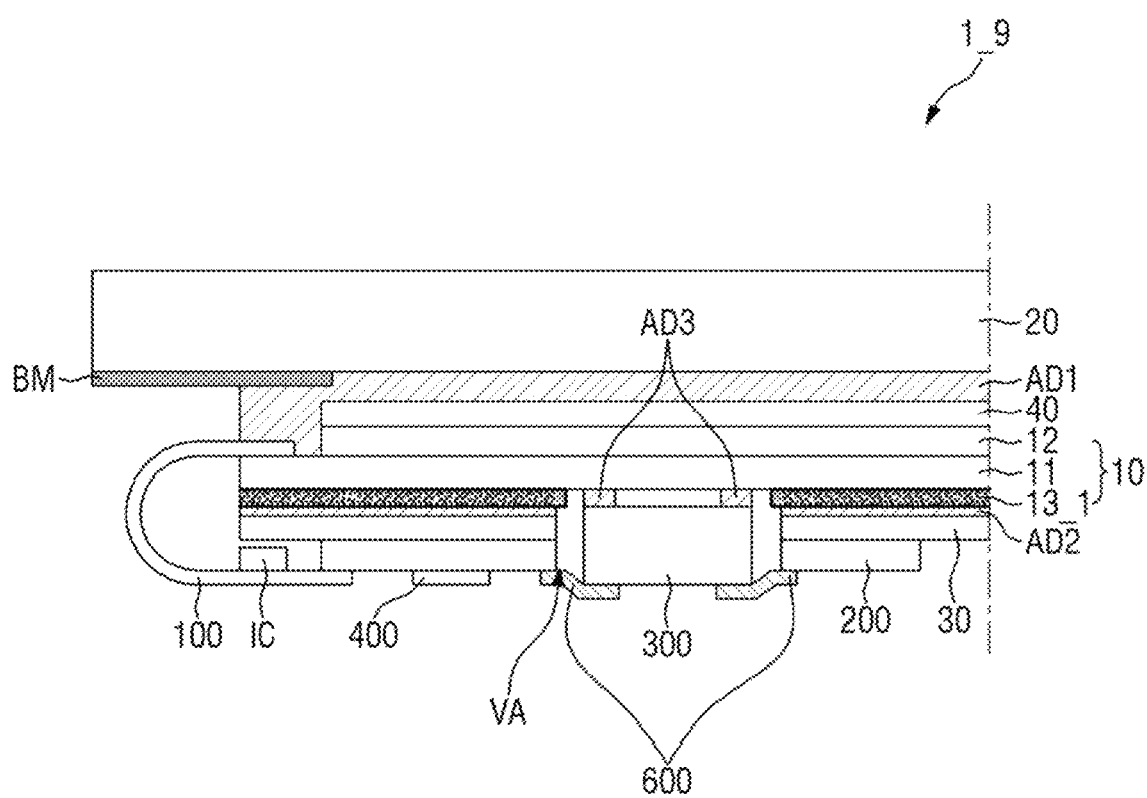

FIGS. 16 and 17 are cross-sectional views of display devices according to exemplary embodiments of the present disclosure. FIGS. 16 and 17 are the cross-sectional views which are the counterpart of FIG. 9.

Referring to FIGS. 11 and 16, a display device 1_8 is different from the display device 1_5 of FIG. 11 in that the display device 1_8 further includes the second light-blocking portion 600.

The second light-blocking portion 600 may be substantially identical to the second light-blocking portion 600 described above with reference to FIG. 7; and, therefore, the omitted description of the other elements may be understood to be at least similar to corresponding elements that have already been described.

The second light-blocking portion 600 is disposed under the driving circuit board 200 and the optical sensor 300 and may cover the void area VA (see FIG. 2). In addition, as described above with reference to FIG. 8, the second light-blocking portion 600 may include the optical sensor 300 (or the fourth hole H4 that has a rectangular shape conforming to the second hole H2 when viewed from the top and is in line with the center of the area of FIG. 8).

The second light-blocking portion 600 may shield the void area VA together with the protective layer 13_1 and the first light-blocking portion 500 so that the optical sensor 300 can be more stably secured to it.

Referring to FIGS. 16 and 17, a display device 1_9 is different from the display device 1_8 of FIG. 16 in that the display device 1_9 does not include the first light-blocking portion 500.

In the display device 1_9, by adjusting the thickness of the second adhesive member AD2_1 (for example, to be relatively thick), the lower surface of the optical sensor 300 and the lower surface of the driving circuit board 200 may be located on the same plane or may become even, as described above with reference to FIG. 9.

For example, in order to make the display device 1 smaller and thinner, the protective layer 13_1 is employed so that the void area VA is shielded, and the part of the void area VA, which is not shielded by the protective layer 13_1, may be shielded by the second light-blocking portion 600.

Figure 18:
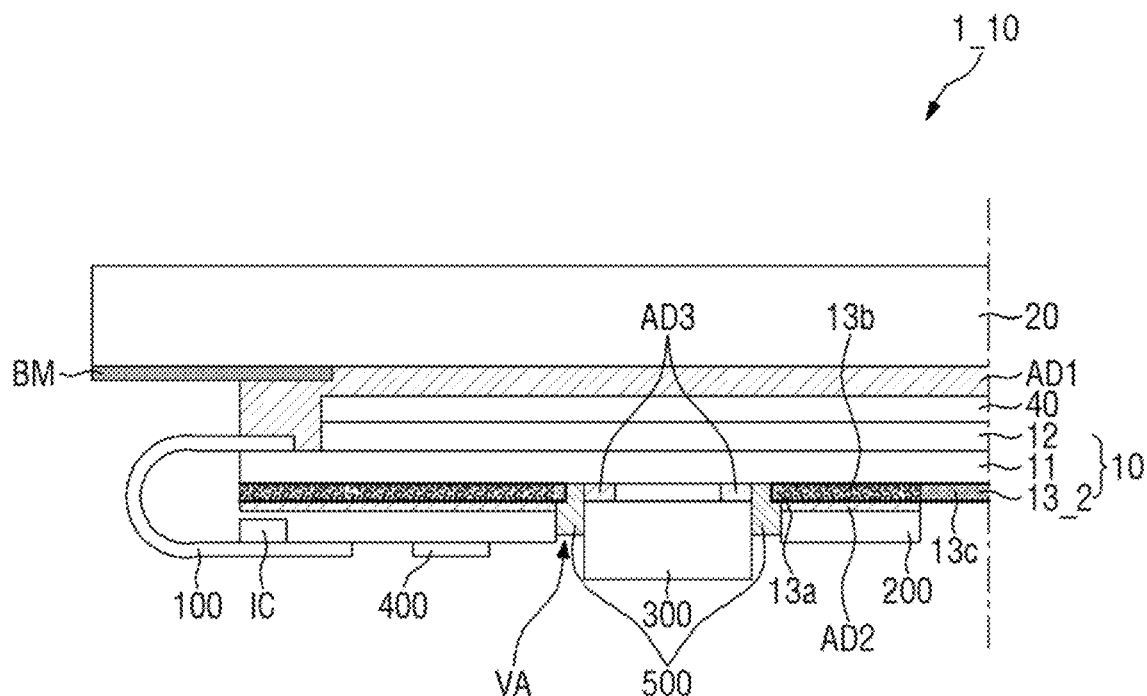
FIG. 18 is a cross-sectional view illustrating a display device according to an exemplary embodiment of the present disclosure.

FIG. 18 is a cross-sectional view of a display device according to an exemplary embodiment of the present disclosure. FIG. 18 is the cross-sectional view which is the counterpart of FIG. 3.

Referring to FIGS. 3 and 18, a display device 1_10 is different from the display device 1 of FIG. 3 in that the former does not include the panel support sheet 30 but includes a protective layer 13_2. The panel support sheet 30 may be an additional light-blocking member or light-blocking sheet.

The display device 1_10 is substantially identical to the display device 1 of FIG. 3 except the protective layer 13_2; and, therefore, the omitted description of the other elements may be understood to be at least similar to corresponding elements that have already been described.

Similarly to the protective layer 13_1 described with reference to FIG. 11, the protective layer 13_2 may include a photochromic raw material.

Since the display device 10 does not include the panel support sheet 30 and is disposed only on a part of the lower surface of the display panel 10 of the driving circuit board 200 as described above with reference to FIG. 2, the protective layer 13_1 may include a third portion 13c exposed by the driving circuit board 200.

As described above with reference to FIG. 13, when the display device 1_10 is exposed to ultraviolet rays, the color of the first portion 13a and the color of the third portion 13c of the protective layer 13_2 are changed, such that the first portion 13a and the third portion 13c can block light. Although the second portion 13b of the protective layer 13_2 is not exposed to ultraviolet rays, and thus cannot block light, the part in line with the second portion 13b of the protective layer 13_2 can be shielded by the driving circuit board 200 (or the heat dissipation sheet, the electromagnetic wave shielding sheet, etc. disposed below the driving circuit board 200). As a result, the display device 1_10 can become smaller, lighter and thinner.

In the above description, the present invention has been described based on the exemplary embodiments, but the exemplary embodiments are for illustrative, and do not limit the present invention, and those skilled in the art will appreciate that various modifications and applications, which are not exemplified in the above description, may be made without departing from the scope of the essential characteristic of the present exemplary embodiments.

What is claimed is:

1. A display device, comprising:
a display panel comprising a display area and a non-display area at least partially surrounding the display area;
a panel support sheet disposed behind the display panel and having a first hole exposing the display area of the display panel;
an optical sensor disposed within the first hole; and
a first light-blocking portion disposed in a void area that is between the panel support sheet and the optical sensor, within the first hole,
wherein the optical sensor is attached to the display panel by an adhesive member, and
wherein the adhesive member is disposed along an edge of one surface of the optical sensor.

2. The display device of claim 1, wherein the first light-blocking portion includes an opaque adhesive resin.

3. The display device of claim 1, further comprising:
a driving circuit board disposed on the panel support sheet, the driving circuit board being electrically connected to the display panel, and comprising a second hole exposing the display area of the display panel through the first hole, wherein the optical sensor is disposed within the second hole.

4. The display device of claim 3, further comprising:
a first flexible circuit board disposed behind the driving circuit board and electrically connecting the optical sensor with the driving circuit board, wherein the first light-blocking portion is disposed within a part of the void area that does not overlap with the first flexible circuit board.

5. The display device of claim 1, wherein the adhesive member has an opening in a center thereof.

6. The display device of claim 1, wherein the optical sensor is a fingerprint recognition sensor.

7. The display device of claim 1, further comprising:
a protective layer disposed between the display panel and the panel support sheet and comprising a third hole that is larger than the first hole,
wherein the optical sensor is disposed within the third hole, and wherein the first light-blocking portion is disposed between the optical sensor and an inner side surface of the protective layer in the third hole.

8. The display device of claim 1, further comprising:
a second light-blocking portion disposed behind the optical sensor,
wherein the second light-blocking portion partially overlaps with the panel support sheet and the optical sensor and covers the void area.

9. The display device of claim 8, wherein the second light-blocking portion comprises a fourth hole exposing, the optical sensor.

10. The display device of claim 9, further comprising:
a driving circuit board disposed on the panel support sheet, electrically connected to the display panel, and comprising a second hole exposing the display area of the display panel through the first hole,
wherein the optical sensor is disposed within the second hole, and a surface of the driving circuit board and a surface of the optical sensor is located on a same plane.

11. The display device of claim 1, wherein the first light-blocking portion is configured to absorb light transmitted through the void area.

12. The display device of claim 1, wherein the optical sensor contacts the first light-blocking portion.

13. A display device, comprising:
a display panel comprising a display area and a non-display area at least partially surrounding the display area;
a panel support sheet disposed behind the display panel and having a first hole exposing the display area of the display panel;
an optical sensor disposed within the first hole; and
a first light-blocking portion disposed in a void area that is between the panel support sheet and the optical sensor, within the first hole,
wherein the panel support sheet comprises a first functional layer and a second functional layer stacked on the first functional layer, and wherein the first functional layer is a buffering layer, and the second functional layer is a digitizer.

14. A display device, comprising:
a display panel comprising a display area and a non-display area at least partially surrounding the display area;
a panel support sheet disposed behind the display panel and having a first hole exposing the display area of the display panel;
an optical sensor disposed within the first hole;
a first light-blocking portion disposed in a void area that is between the panel support sheet and the optical sensor, within the first hole; and
a protective layer disposed between the display panel and the panel support sheet, the protective layer comprising a third hole smaller than the first hole and larger than the optical sensor,
wherein the optical sensor is disposed within the third hole, and
wherein the protective layer comprises a photochromic raw material configured to change color in response to exposure to ultraviolet rays, and
wherein a color of a first portion of the protective layer exposed through the first bole is different from a color of a second portion of the protective layer overlapping with the panel support sheet.

15. The display device of claim 14, wherein the protective layer further comprises: a latent heat shift register pigment configured to absorb heat generated in the display panel.

16. The display device of claim 14, wherein the first light-blocking portion overlaps the first portion of the protective layer.

17. The display device of claim 14, wherein the first light-blocking portion does not overlap the first portion of the protective layer.

18. The display device of claim 14, further comprising:
a transparent adhesive resin disposed between the protective layer and the optical sensor,
wherein the first light-blocking, portion covers the first portion of the protective layer and the transparent adhesive resin.

19. The display device of claim 14, further comprising:
a second light-blocking portion disposed behind the optical sensor,
wherein the second light-blocking portion partially overlaps the panel support sheet and the optical sensor and covers the void area.

\* \* \* \* \*